United States Patent
Trichy Rengarajan et al.

(10) Patent No.: US 9,978,711 B2
(45) Date of Patent: May 22, 2018

(54) METHOD FOR CONNECTING A SEMICONDUCTOR CHIP METAL SURFACE OF A SUBSTRATE BY MEANS OF TWO CONTACT METALLIZATION LAYERS AND METHOD FOR PRODUCING AN ELECTRONIC MODULE

(71) Applicant: Infineon Technologies AG, Neubiberg (DE)

(72) Inventors: Gopalakrishnan Trichy Rengarajan, Lippstadt (DE); Christian Stahlhut, Rinteln (DE)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/378,993

(22) Filed: Dec. 14, 2016

(65) Prior Publication Data
US 2017/0170143 A1 Jun. 15, 2017

(30) Foreign Application Priority Data
Dec. 15, 2015 (DE) .................... 10 2015 121 775

(51) Int. Cl.
*H01L 23/00* (2006.01)
*H01L 21/48* (2006.01)
(52) U.S. Cl.
CPC .......... *H01L 24/83* (2013.01); *H01L 21/4825* (2013.01); *H01L 21/4853* (2013.01); *H01L 2224/83203* (2013.01)

(58) Field of Classification Search
CPC .. H01L 24/83; H01L 21/4825; H01L 21/4853
See application file for complete search history.

(56) References Cited

U.S. PATENT DOCUMENTS

| | | | | |
|---|---|---|---|---|
| 2004/0084769 A1* | 5/2004 | Sugaya | ............ | H01L 23/49822 257/734 |
| 2009/0001402 A1 | 1/2009 | Sakai | | |

(Continued)

FOREIGN PATENT DOCUMENTS

| | | |
|---|---|---|
| DE | 4226167 A1 | 2/1994 |
| EP | 1783829 A1 | 5/2007 |

*Primary Examiner* — Karen Kusumakar
(74) *Attorney, Agent, or Firm* — Murphy, Bilak & Homiller, PLLC

(57) ABSTRACT

A semiconductor chip includes a semiconductor body having a lower side with a lower chip metallization applied thereto. A first contact metallization layer is produced on the lower chip metallization. A second contact metallization layer is produced on a metal surface of a substrate. The semiconductor chip and the substrate are pressed onto one another for a pressing time so that the first and second contact metallization layers bear directly and extensively on one another. During the pressing time, the first contact metallization layer is kept continuously at temperatures which are lower than the melting temperature of the first contact metallization layer. The second contact metallization layer is kept continuously at temperatures which are lower than the melting temperature of the second contact metallization layer during the pressing time. After the pressing together, the first and second contact metallization layers have a total thickness less than 1000 nm.

19 Claims, 4 Drawing Sheets

(56) References Cited

U.S. PATENT DOCUMENTS

| | | |
|---|---|---|
| 2013/0092948 A1 | 4/2013 | Otsuka |
| 2013/0206821 A1* | 8/2013 | Saito ............... B23K 20/02 228/208 |
| 2013/0221514 A1 | 8/2013 | Otsuka et al. |
| 2017/0178929 A1* | 6/2017 | Chidambaram ........ H01L 21/50 |

* cited by examiner

METHOD FOR CONNECTING A SEMICONDUCTOR CHIP METAL SURFACE OF A SUBSTRATE BY MEANS OF TWO CONTACT METALLIZATION LAYERS AND METHOD FOR PRODUCING AN ELECTRONIC MODULE

PRIORITY CLAIM

This application claims priority to German Patent Application No. 10 2015 121 775.9 filed on 15 Dec. 2015, the content of said application incorporated herein by reference in its entirety.

TECHNICAL FIELD

The invention relates to the material-fit connection of a semiconductor chip to a substrate.

BACKGROUND

Conventionally, such connections are produced by means of a solder, a sintered metal powder or an adhesive. The production of such known material-fit connections is, however, elaborate, since the connecting medium, i.e. the solder, the metal powder or the adhesive, has to be applied onto the semiconductor chip or the substrate. Many individual steps are required for this. Furthermore, there is the risk that the connecting medium may contaminate the surroundings. For example, an electrically conductive connecting medium which accidentally splashes, runs or crumbles may lead to electrical short circuits of an electronic module to be produced.

SUMMARY

An object of the present invention is to provide a simple and economical method for the material-fit connection of a semiconductor to a substrate, as well as an improved method for producing an electronic module.

A first aspect relates to the connection of a semiconductor chip to a substrate. The semiconductor chip comprises a semiconductor body having a lower side onto which a lower chip metallization is applied. The substrate has a metal surface. A first contact metallization layer is produced on the lower chip metallization, and a second contact metallization layer is produced on the metal surface of the substrate. The semiconductor chip and the substrate are pressed onto one another for a pressing time so that the first contact metallization layer and the second contact metallization layer bear directly and extensively on one another. During the pressing time, the first contact metallization layer is kept continuously at temperatures which are lower than the melting temperature of the first contact metallization layer. Correspondingly, the second contact metallization layer is kept continuously at temperatures which are lower than the melting temperature of the second contact metallization layer during the pressing time. After the pressing together, the first contact metallization layer and the second contact metallization layer have a total layer thickness which is less than 1000 nm.

A second aspect relates to the production of an electronic module. In this case, a semiconductor chip, which comprises a semiconductor body having a lower side onto which a lower chip metallization is applied, and which comprises an upper side onto which an upper chip metallization is applied, is connected by a method according to the first aspect to a metal surface of a substrate. Furthermore, an electrically conductive connection element is bonded directly onto the upper chip metallization.

Those skilled in the art will recognize additional features and advantages upon reading the following detailed description and on viewing the accompanying drawings.

BRIEF DESCRIPTION OF THE DRAWINGS

The invention is explained below with the aid of exemplary embodiments with reference to the appended figures. The representation in the figures is not to scale. In the figures.

DETAILED DESCRIPTION

The representation in the figures is not to scale. Unless otherwise mentioned, the features and/or method steps explained with the aid of the various exemplary embodiments may be combined with one another.

Figure 1:
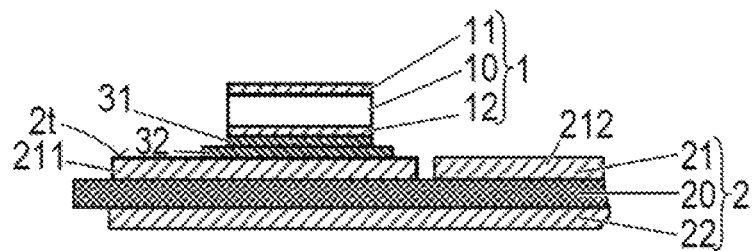
FIG. 1 shows a cross section through a partially fabricated electronic module.
Figure 2A:
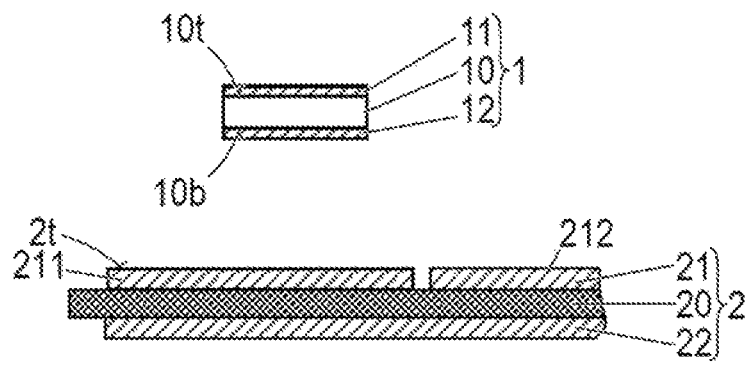
FIGS. 2A to 2D show various steps of a method for producing an electronic module.

FIG. 1 shows a cross section through a partially fabricated electronic module, having a semiconductor chip 1 which is connected with a material fit to an electrically conductive metal surface 2t of a substrate 2. FIG. 2A shows the semiconductor chip 1 provided and the substrate 2 provided, before the production of this material-fit connection.

As shown in FIG. 2A, the semiconductor chip 1 has a semiconductor body 10 with an upper side 10t and lower side 10b. The upper side 10t and the lower side 10b form mutually opposite sides of the semiconductor body 10. A lower chip metallization 12 is applied onto the lower side 10b. Furthermore, an upper chip metallization 11 may optionally be applied onto the upper side 10t. The lower chip metallization 12 and, if present, the upper chip metallization 11 are used for external electrical contacting of the semiconductor chip 1.

The semiconductor chip 1 may, for example, be a diode or a controllable semiconductor switch, for example an IGBT (insulated gate bipolar transistor), a MOSFET (metal oxide semiconductor field effect transistor), a thyristor (for example a GTO thyristor; GTO=gate turn-off), a junction field effect transistor (JFET), for example also as an HEMT (high electron mobility transistor).

The semiconductor chip 1 may optionally also be configured as a so-called vertical semiconductor chip, which is connected on its side facing toward the substrate 2 with a material fit and electrically conductively to the metal surface 2t of the substrate 2, so that during operation of the electronic module a load current can flow through the semiconductor chip 1, from the upper chip metallization 11 through the semiconductor body 10 and the lower chip metallization 12 to the metal surface 2t.

The upper and lower chip metallizations 11, 12 may for example, depending on the type of component, be a source metallization and a drain metallization, a drain metallization and a source metallization, a collector metallization and an emitter metallization, an emitter metallization and a collector metallization, an anode metallization and a cathode metallization, or a cathode metallization and an anode metallization.

The substrate 2 comprises at least one metal surface 2t. As shown in the present example, the substrate 2 may optionally comprise a dielectric insulation carrier 20, which is formed as a flat platelet and has an upper main surface and a lower main surface, opposite the upper main surface. An upper substrate metallization 21, which may optionally be structured to form conductive tracks and/or conductive surfaces 211, 212 which are spaced apart from one another, is applied onto the upper main surface of the insulation carrier 20. Furthermore, an optional lower substrate metallization 22 may be applied onto the lower main surface of the insulation carrier 20. The lower substrate metallization 22 is unstructured, although as an alternative it may also be structured. The electrically conductive metal surface 2t of the substrate 2 is formed by the upper substrate metallization 21, here for example by the conductive track or conductive surface 211.

The substrate metallizations 21 and 22 are connected firmly and extensively to the insulation carrier 20 with a material fit. In particular, the upper substrate metallization 21 may be connected firmly to the insulation carrier 20 with a material fit over its entire side facing toward the insulation carrier 20. Correspondingly, a lower substrate metallization 22 may also be connected firmly to the insulation carrier 20 with a material fit over its entire side facing toward the insulation carrier 20.

The insulation carrier 20 is electrically insulating. It may, for example, comprise ceramic or consist of ceramic. Suitable ceramics are for example aluminum nitride (AlN), aluminum oxide ($Al_2O_3$), silicon nitride ($Si_3N_4$), silicon carbide (SiC) or beryllium oxide (BeO), or other dielectric ceramics. The upper substrate metallization 21 and, if present, the lower substrate metallization 22 may for example consist of copper, a copper alloy, aluminum or an aluminum alloy, or comprise one of these materials. Other highly electrically conductive metals, including alloys, may however likewise be used. Furthermore, the upper substrate metallization 21 and, if present, the lower substrate metallization 22 may respectively comprise two or more sublayers, each of which consists of a metal or metal alloy.

According to one configuration, the substrate 2 may be a DCB substrate (DCB=direct copper bonded), in which the upper substrate metallization 21 and—if present—the lower substrate metallization 22 are produced by connecting prefabricated copper foils, which are oxidized on the surface, by the DCB process to a ceramic insulation carrier 20, for example made of aluminum oxide.

Figure 2B:
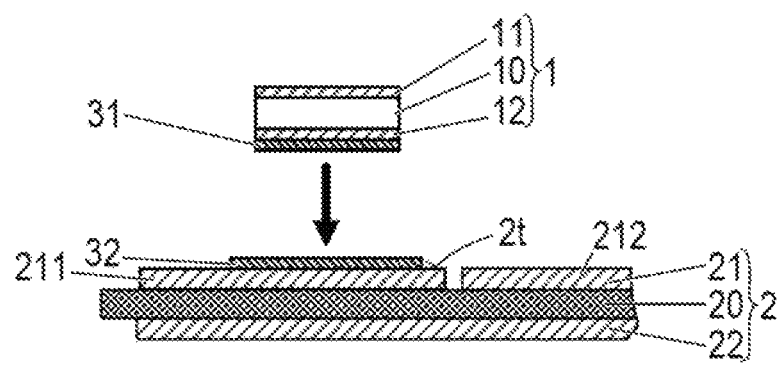

In order to connect the semiconductor chip 1 with a material fit and electrically conductively to the substrate 2, the result being shown in FIG. 1, a first contact metallization layer 31 is produced on the lower chip metallization 12, i.e. on its side facing away from the semiconductor body 10. Furthermore, a second contact metallization layer 32 is produced on the metal surface 2t of the substrate 2. If the substrate 2 comprises a dielectric insulation carrier 20, the second contact metallization layer 32 is produced on the side of the upper substrate metallization 21 facing away from the insulation carrier 20. FIG. 2B shows the semiconductor chip 1 comprising the first contact metallization layer 31 and the substrate 2 comprising the second contact metallization layer 32.

Figure 2C:
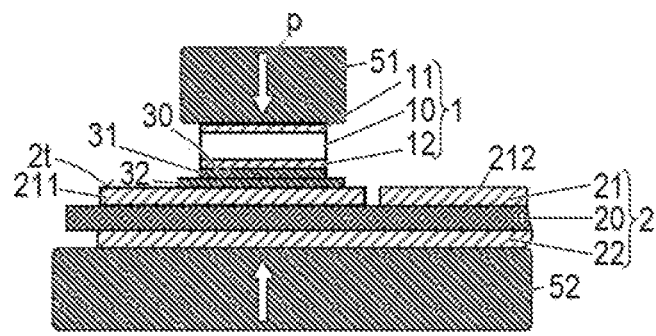

Subsequently, as represented in FIG. 2C, the semiconductor chip 1 and the substrate 2 are pressed onto one another so that the first contact metallization layer 31 and the second contact metallization layer 32 bear directly and extensively on one another on a common interface 30. The size of the interface 30 is in principle arbitrary. In the case of a semiconductor chip 1 configured as a power semiconductor element, however, it may have a very large area, for example at least 1 $mm^2$ or even at least 10 $mm^2$. The interface 30 may, in particular, be formed as a closed, uninterrupted surface.

The pressing together may be carried out by means of a press which comprises an upper pressing piece 51 and a lower pressing piece 52, and between which the semiconductor chip 1 provided with the first contact metallization layer 31 and the substrate 2 provided with the second contact metallization layer 32 are clamped—with their contact metallization layers 31 and 32 bearing directly on one another.

By the pressing together, an electrically conductive material-fit connection is formed in the region of the interface 30 between the first contact metallization layer 31 and the second contact metallization layer 32, and therefore also between the semiconductor chip 1 and the substrate 2. This electrically conductive material-fit connection is also maintained when there is no longer an application pressure p between the semiconductor chip 1 and the substrate 2.

Figure 2D:
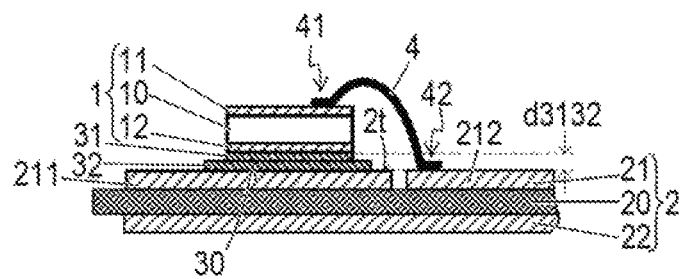

Optionally, the material-fit connection formed in this way between the semiconductor chip 1 and the substrate 2 may be processed further. FIG. 2D shows one example of this. As schematically represented here, an electrically conductive connecting element 4, for example a bonding wire or a flat strip, may be bonded directly onto the upper chip metallization 11 so as to form a first bond connection 41. Optionally, the electrically conductive connecting element 4 may be connected directly to any other desired element of an electronic module to be produced, different to the upper chip metallization 11, so as to form a second bond connection 42, which is different to the first bond connection 41. According to the example shown, the second bond connection 42 may be formed between the connecting element 4 and a conductive track or surface 212 formed in the upper substrate metallization 21. The conductive track or surface 212 is separated from a conductive surface 211, likewise formed in the upper substrate metallization layer 21, onto which the second contact metallization layer 32 is applied.

In the example according to FIGS. 2A to 2D, the substrate 2 is configured as an insulating substrate which comprises an insulation carrier 20 and at least one upper substrate metallization 21. In contrast thereto, the substrate 2 may for example also be configured as a metal lead frame, which is shown with the aid of FIGS. 3A to 3D. Apart from the different structure of the substrate 2, the method is carried out in the same way as in the method explained with the aid of FIGS. 2A to 2D.

Figure 3A:
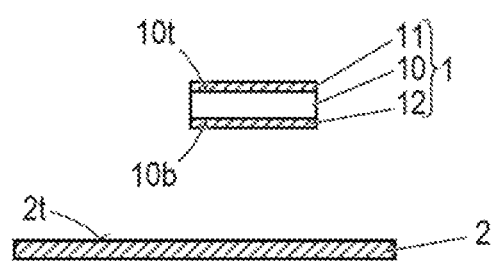
FIGS. 3A to 3D show various steps of a method for producing a further electronic module.

The semiconductor chip 1 provided may be a semiconductor chip 1 as already described above with reference to FIGS. 1 and 2A to 2D (FIG. 3A). The substrate 2 provided (FIG. 3A) is a metal lead frame, which comprises a metal surface 2t.

A first contact metallization layer 31 is produced (FIG. 3B) on the lower chip metallization 12, i.e. on its side facing away from the semiconductor body 10, as was explained with reference to FIG. 2B. Furthermore, a second contact metallization layer 32 is produced (FIG. 3B) on the metal surface 2t of the substrate 2, as was likewise explained with reference to FIG. 2B.

Figure 3B:
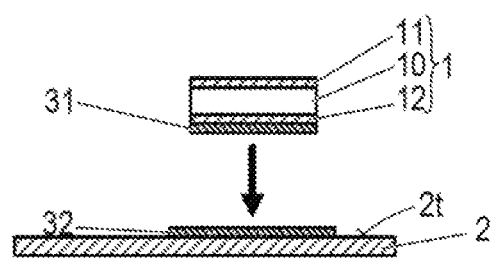
Figure 3C:
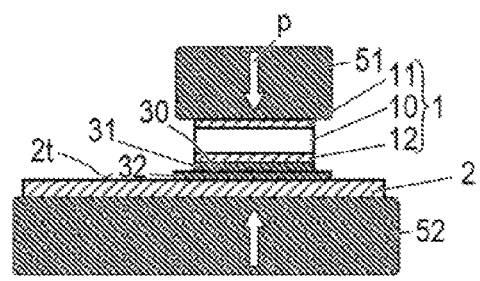

Subsequently, as represented in FIG. 3C, the semiconductor chip 1 and the substrate 2 are pressed onto one another so that the first contact metallization layer 31 and the second contact metallization layer 32 bear directly and extensively on one another on a common interface 30. The pressing together may be carried out in the same way as explained with reference to FIG. 2C.

Optionally, the material-fit connection formed after the pressing between the semiconductor chip 1 and the substrate 2 may be processed further.

Figure 3D:
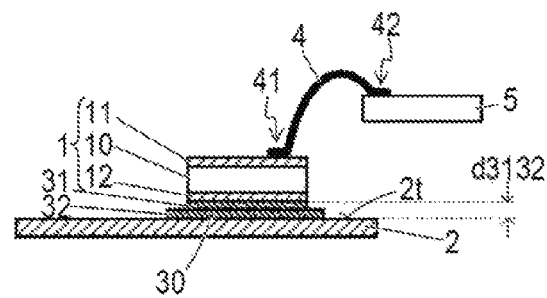

As schematically represented in FIG. 3D, an electrically conductive connecting element 4, for example a bonding wire or a flat strip, may be bonded directly onto the upper chip metallization 11 so as to form a first bond connection 41. Optionally, the electrically conductive connecting element 4 may be connected directly to any other desired electrical element 5 (for example an active or passive electronic component, or an electrical connection conductor) of an electronic module to be produced, different to the upper chip metallization 11, so as to form a second bond connection 42, which is different to the first bond connection 41. In a similar way thereto, in the example according to FIG. 2D, the second bond connection 42 could also be produced between the electrically conductive connecting element 4 and such an electrical element 5, which is different to the upper chip metallization 11, i.e. the electrical element 5 need not necessarily, as represented in FIG. 2D, be a conductive track or surface of the upper substrate metallization 21.

Figure 4A:
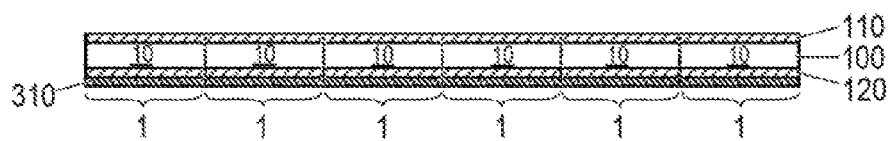
FIGS. 4A to 4B show various steps of a method for producing a first contact metallization layer in the case of a multiplicity of semiconductor chips on a wafer.
Figure 4B:
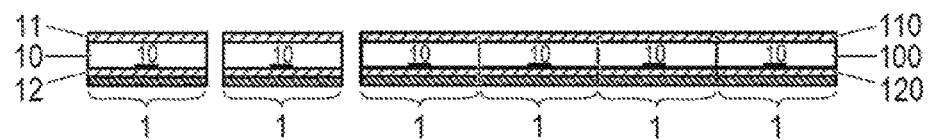

As shown with the aid of the figures above (cf. FIGS. 2A and 2B, and 3A and 3B), the production of the first contact metallization layer 31 on the semiconductor chip 1 may be carried out with an individual semiconductor chip 1. It is, however, likewise possible to produce the first contact metallization layer 31 by applying it onto the semiconductor chip 1 when the latter still lies together with other semiconductor chips 1—of the same design or not of the same design—on the wafer. This will be explained below with the aid of FIGS. 4A and 4B. As schematically represented in FIG. 4A, a semiconductor wafer 100 may comprise the semiconductor body 10 for a plurality of semiconductor chips 1—of the same design or not of the same design. An upper wafer metallization 110 and a lower wafer metallization 120 may then be applied onto the semiconductor wafer 100. Furthermore, a further metallization layer 310 may be applied onto the side of the lower wafer metallization 120 facing away from the wafer 100, the result being shown in FIG. 4A. The dashed lines indicate where the semiconductor chips 1 still on the wafer will subsequently be separated. FIG. 4B shows on the left two semiconductor chips 1 which have already been separated, and on the right the rest of the wafer, which contains the other semiconductor chips 1 which have not yet been separated.

Each of the separated semiconductor chips 1 may be used for the method explained with the aid of FIGS. 1, 2A to 2D and 3A to 3D.

In the separated semiconductor chips 1, the material and the thickness of the upper chip metallization 11 correspond to the material and the thickness of the upper wafer metallization 110, the material and the thickness of the lower chip metallization 12 correspond to the material and the thickness of the of the lower wafer metallization 120, and the material and the thickness of the further wafer metallization 310 correspond to the material and the thickness of the first contact metallization layer 31.

In a similar way thereto, the production of the second contact metallization layer 32 on the metal surface 2t of the substrate 2 may be carried out with an individual substrate 2, or alternatively in a state in which the substrate 2 lies on the panel (i.e. on the wafer) with two or more substrates 2—of the same design or not of the same design.

Figure 5:
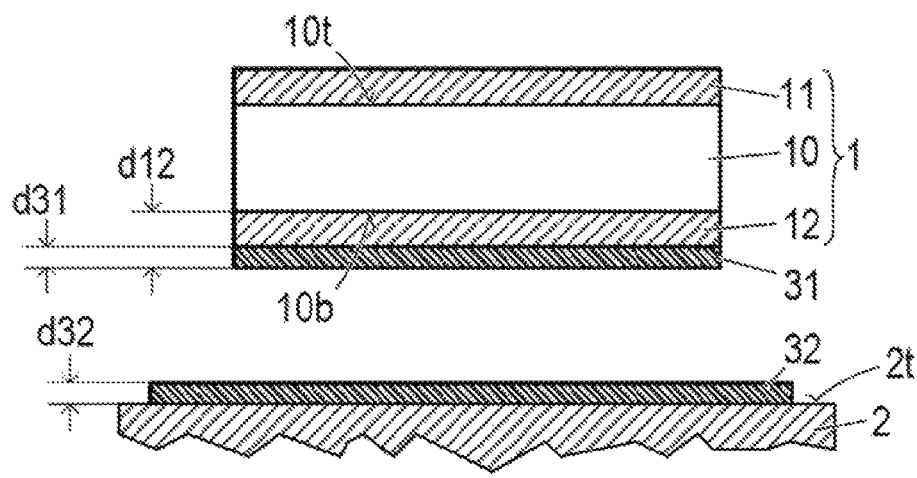
FIG. 5 shows an enlarged view of a semiconductor chip and of a surface of a substrate, which are respectively provided with a contact metallization layer in accordance with FIGS. 2B and 3B.

FIG. 5 in turn shows an enlarged section of the arrangements according to FIG. 2B or 3B. Represented here are the layer thicknesses d12 of the lower chip metallization 12, d31 of the first contact metallization layer 31, and d32 of the second contact metallization layer 32.

The layer thickness d31 of the first contact metallization layer 31 may be selected to be very small, and it may for example be selected to be less than or equal to 1000 nm, or even less than or equal to 500 nm.

Independently thereof, the layer thickness d32 of the second contact metallization layer 32 may be selected to be very small, and it may for example be selected to be less than or equal to 1000 nm, or even less than or equal to 500 nm.

Likewise independently thereof, the layer thickness d12 of the lower chip metallization 12 may, for example, be selected to be greater than or equal to 400 nm.

The total thickness d3132 of the first contact metallization layer 31 and the second contact metallization layer 32 after the semiconductor chip 1 and the substrate 2 have been pressed onto one another (i.e. with the completed material-fit connection between the semiconductor chip 1 and the substrate 2) may be very small, for example less than 1000 nm or even less than 400 nm.

Furthermore, the difference d31+d32−d3132 between the sum d31+d32 of the thicknesses d31, d32 of the first and second contact metallization layers 31, 32 after their production and before the pressing together, and their total layer thickness d3132 after the pressing together, may be less than 200 nm. This difference may be greater than zero, which means that the contact metallization layers 31, 32 are plastically deformed by the pressing together. This deformation, however, is only very small.

The pressing together of the semiconductor chip 1 and of the substrate 2 (FIGS. 2C and 3C) may be carried out in such a way that the semiconductor chip 1 and the substrate 2 are pressed onto one another during a pressing time continuously with application pressures p which are greater than a minimum application pressure of at least 35 MPa, or even at least 50 MPa. The method may be used with even very short pressing times, for example less than 2 minutes. It is, however, to be understood that the pressing time may also be 2 minutes or more.

During the pressing, in particular during the pressing time, the first contact metallization layer 31 and the second contact metallization layer 32 may be kept continuously at temperatures below 300° C. Furthermore, the first contact metallization layer 31 and the second contact metallization layer 32 may be kept continuously at temperatures of at least 250° C. during the pressing time.

Furthermore, the first contact metallization layer 31 may be kept continuously at temperatures which are lower than the melting temperature of the first contact metallization layer 31 during the pressing time, and the second contact metallization layer 32 may be kept continuously at temperatures which are lower than the melting temperature of the second contact metallization layer 32 during the pressing time.

For example, precisely one metal or a homogeneous metal alloy are suitable as material for the first contact metallization layer 31. In particular, the first contact metallization layer 31 may consist of a noble metal or comprise a noble metal (for example gold, silver, platinum, ruthenium, osmium, rhodium, iridium). In principle, however, semi-noble metals or non-noble metals in pure form or in alloy may also be used (for example aluminum or an aluminum alloy).

Independently of the material for the first contact metallization layer 31, precisely one metal or a homogeneous alloy, for example, are suitable as material for the second contact metallization layer 32. In particular, the second contact metallization layer 32 may consist of a noble metal or comprise a noble metal (for example gold, silver, platinum, ruthenium, osmium, rhodium, iridium). In principle, however, semi-noble metals or non-noble metals in pure form or in alloy may also be used (for example aluminum or an aluminum alloy).

Optionally, the first contact metallization layer 31 and the second contact metallization layer 32 may consist of the same material or the same homogeneous alloy.

The production of the first contact metallization layer 31 on the lower chip metallization 12 and the production of the second contact metallization layer 32 on the electrically conductive surface 2t of the substrate 2 may respectively be carried out by means of a deposition method, in which the first contact metallization layer 31 and the second contact metallization layer 32 are applied not as prefabricated layers onto the lower chip metallization 12 or the electrically conductive surface 2t of the substrate 2, respectively, but by not forming the contact metallization layers 31, 32 until during the deposition process (i.e. built up continuously or successively). Suitable deposition methods are for example sputtering, physical vapor deposition (PVD), chemical vapor deposition (CVD), electroless or electrolytic deposition. The same also applies for the production of the further metallization layer 310 on the wafer 100 (FIG. 4A). The metallization layers 31, 32, 310 produced by the deposition are not porous, as is the case for example for silver powder layers that are used in conventional sintered connection methods. The metallization layers 31, 32, 310 are accordingly formed as homogeneous layers, which do not consist of a pressed powder. In particular, the metallization layers 31, 32, 310 may be formed as continuous, uninterrupted layers.

In all cases, the deposition may be carried out by masking, with the use of a mask in the openings of which the deposited material respectively grows directly on the lower chip metallization 12 (or the lower wafer metallization 120), or on the electrically conductive surface 2t of the substrate 2.

Likewise, however, it is possible for the deposition to be carried out without masking, so that the deposited material forms a closed, uninterrupted layer, which is subsequently structured in a manner known per se by using a mask (for example photolithographically).

It is to be understood that the production of the first contact metallization layer 31 on the lower chip metallization 12 or the production of the further metallization layer 310 on the lower wafer metallization 120, on the one hand, and the production of the second contact metallization layer 32 on the electrically conductive surface 2t of the substrate 2, on the other hand, may be carried out with the aid of the same deposition methods or different deposition methods, in any desired combinations.

In tests, an outstanding strength of the material-fit connection between the semiconductor chip 1 and a substrate 2 configured as a DOB substrate have been found. Gold was in each case used as material for the first contact metallization layer 31 and the second contact metallization layer 32. The production of the contact metallization layers 31 and 32 was respectively carried out by sputtering (sputtering time: 4 minutes; sputtering gas: argon). The layer thicknesses d31 and d32 obtained were each 400 nm. The pressing time lasted 2 minutes, the application pressure was 55 MPa, and the common interface 30 was 50 mm$^2$. In bending tests subsequently carried out, no delamination between the semiconductor chip 1 and the DOB substrate 2 was exhibited.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for connecting a semiconductor chip, which comprises a semiconductor body having a lower side onto which a lower chip metallization is applied, to a substrate which has a metal surface and is devoid of resin, the method comprising:
    producing a first contact metallization layer on the lower chip metallization;
    producing a second contact metallization layer on the metal surface of the substrate; and
    pressing the semiconductor chip and the substrate onto one another for a pressing time so that the first contact metallization layer and the second contact metallization layer bear directly and extensively on one another and an electrically conductive material-fit connection is formed between the first contact metallization layer and the second contact metallization layer without either contact metallization layer embedding in the substrate during the pressing time,
    wherein the first contact metallization layer is kept continuously at temperatures which are lower than the melting temperature of the first contact metallization layer during the pressing time,
    wherein the second contact metallization layer is kept continuously at temperatures which are lower than the melting temperature of the second contact metallization layer during the pressing time,
    wherein a total layer thickness of the first contact metallization layer and the second contact metallization layer after the pressing together is less than 1000 nm.

2. The method of claim 1, wherein the first contact metallization layer has a layer thickness of less than 400 nm before the pressing of the semiconductor chip and the substrate onto one another.

3. The method of claim 1, wherein the first contact metallization layer consists of one metal or a homogeneous alloy.

4. The method of claim 1, wherein the first contact metallization layer consists of a noble metal or comprises a noble metal.

5. The method of claim 1, wherein the first contact metallization layer is produced by means of a deposition method.

6. The method of claim 1, wherein the second contact metallization layer has a layer thickness of less than 400 nm before the pressing of the semiconductor chip and the substrate onto one another.

7. The method of claim 1, wherein the second contact metallization layer consists of one metal or one homogeneous alloy.

8. The method of claim 1, wherein the second contact metallization layer consists of a noble metal or comprises a noble metal.

9. The method of claim 1, wherein the second contact metallization layer is produced by means of a deposition method.

10. The method of claim 1, wherein the semiconductor chip and the substrate are pressed onto one another during the pressing time continuously with application pressures of at least 35 MPa.

11. The method of claim 10, herein first contact metallization layer and the second contact metallization layer are at temperatures of at least 250° C. during the pressing time.

12. The method of claim 1, wherein the first contact metallization layer and the second contact metallization layer have a common interface of at least 1 mm² during the pressing time.

13. The method of claim 1, wherein a total layer thickness of the first contact metallization layer and the second contact metallization layer after the pressing together is less than 400 nm.

14. The method of claim 1, wherein a difference between a sum of the thicknesses of the first contact metallization layer and the second contact metallization layer before the pressing together, and a total layer thickness of the first contact metallization layer and the second contact metallization layer after the pressing together, is less than 200 nm.

15. The method of claim 1, wherein:
the substrate comprises a dielectric insulation carrier having an upper substrate metallization; and
the metal surface of the substrate is formed by the upper substrate metallization.

16. The method of claim 1, wherein:
the substrate is configured as a metal lead frame; and
the metal surface of the substrate is formed by the metal lead frame.

17. The method of claim 1, wherein the semiconductor body has an upper side onto which an upper chip metallization is applied, the method further comprising:
bonding an electrically conductive connection element directly onto the upper chip metallization.

18. The method of claim 1, wherein the substrate is a direct copper bonded substrate comprising a ceramic insulation carrier and an upper substrate metallization applied to the ceramic insulation carrier, and wherein the metal surface of the substrate is the upper substrate metallization.

19. The method of claim 18, wherein the ceramic insulation carrier is made of aluminum oxide.

* * * * *